United States Patent [19]
Miyoshi

[11] Patent Number: 5,239,223
[45] Date of Patent: Aug. 24, 1993

[54] PIEZOELECTRIC ACTUATOR AND METHOD OF MANUFACTURING THE SAME

[75] Inventor: Takayuki Miyoshi, Tokyo, Japan

[73] Assignee: NEC Corporation, Tokyo, Japan

[21] Appl. No.: 621,288

[22] Filed: Nov. 30, 1990

[30] Foreign Application Priority Data

Dec. 4, 1989 [JP] Japan .................. 1-315774

[51] Int. Cl.⁵ .............................. H01L 41/08
[52] U.S. Cl. .................... 310/328; 310/340
[58] Field of Search ............ 310/328, 340, 366, 338

[56] References Cited

U.S. PATENT DOCUMENTS

| | | | |
|---|---|---|---|
| 2,472,714 | 6/1949 | Massa | 310/328 |
| 2,860,265 | 11/1958 | Mason | 310/328 X |
| 3,313,962 | 4/1967 | Sonderegger | 310/338 |
| 3,364,368 | 1/1968 | Sonderegger | 310/338 |
| 3,461,327 | 8/1969 | Zeiringer | 310/338 |
| 3,495,102 | 2/1970 | List et al. | 310/338 |
| 3,566,163 | 2/1971 | Fischer et al. | 310/338 X |
| 3,602,744 | 8/1971 | Hugli | 310/338 |
| 4,441,044 | 4/1984 | Ruckenbauer et al. | 310/338 |
| 4,553,059 | 11/1985 | Abe et al. | 310/328 |
| 4,781,477 | 11/1988 | Nagasawa | 310/328 X |
| 4,803,393 | 2/1989 | Takahashi | 310/328 |
| 4,814,659 | 3/1989 | Sawada | 310/328 |
| 5,004,945 | 4/1991 | Tomita et al. | 310/328 |

Primary Examiner—Mark O. Budd
Attorney, Agent, or Firm—Laff, Whitesel, Conte & Saret

[57] ABSTRACT

A piezoelectric actuator, comprising an electrostrictive effect element, a metal case and a metal member, each of the metal case and the metal member being provided with a flanged mounting portion on the periphery thereof, either of the metal case or the metal member being provided with an expansion and contraction portion. The element is received in the metal case and is hermetically sealed in such a state that a compressive force is previously applied to the element.

5 Claims, 8 Drawing Sheets

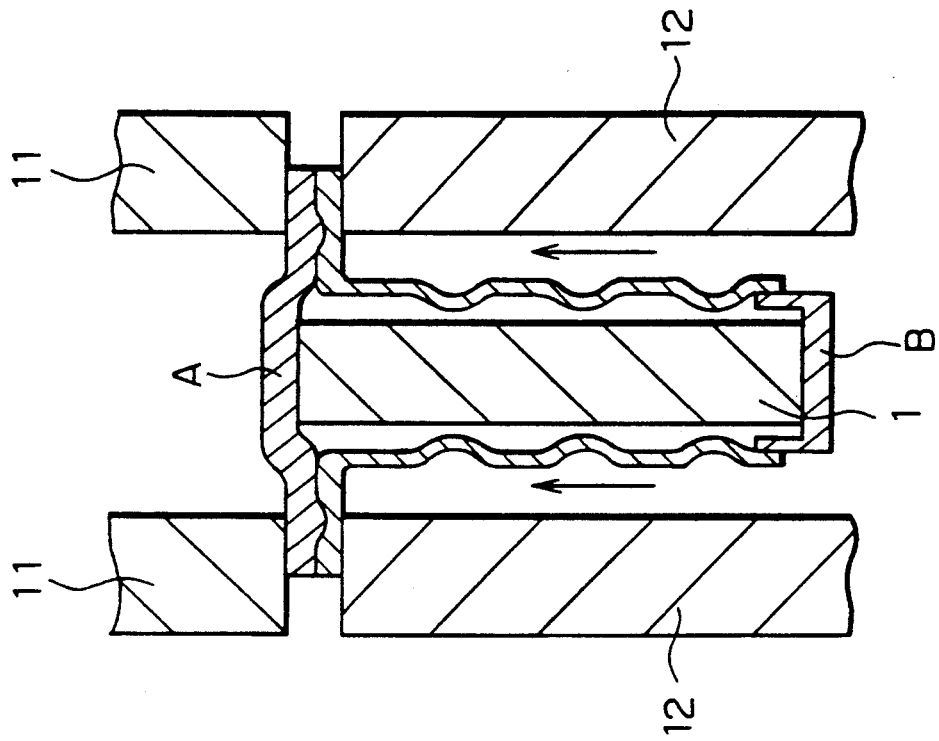
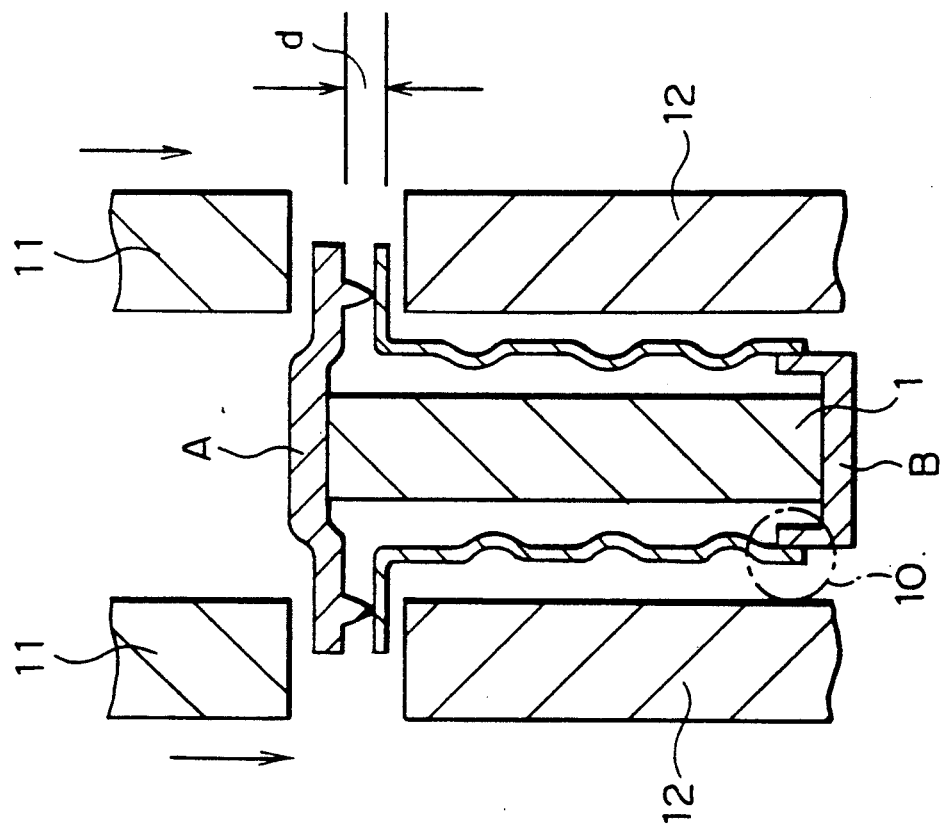

PIEZOELECTRIC ACTUATOR AND METHOD OF MANUFACTURING THE SAME

BACKGROUND OF THE INVENTION

1. Field of the Invention

This invention relates to a piezoelectric actuator and a method of manufacturing the same, particularly to a stacked piezoelectric actuator in which a vertical effect is utilized and a method of manufacturing the same.

2. Description of the Prior Art

A piezoelectric actuator, in which an electrostrictive effect element for transducing electric energy into mechanical energy is utilized, is now used in technological fields such as a mass flow controller, a XY table drive, an injection molding machine and the like.

FIG. 1 shows a longitudinal sectional view of an embodiment of a prior piezoelectric actuator which is received in a metal case.

In this prior art, lead wires 4a and 4b which were drawn from an electrostrictive effect element 1, wherein electrostrictive materials and internal electrodes were stacked by turns, were connected to hermetically sealed lead terminals 2a and 2b sealed with glass 2c, respectively, mounted on a metal member 3 with solder and thereafter the one end face 1a of the electrostrictive effect element 1 is adhered to a concave portion of the metal member 3 with an adhesive such as an epoxy resin or the like. Then, an O ring obtained by molding a resin such as Byton or the like is inserted into a ring channel provided on the periphery of the metal member 3 and thereafter the electrostrictive effect element 1 is inserted into the case 9 through an opening 9a of a cylindrical closed-end metal case 9 to the other end face 1b of the element and the end face 1b is adhered and fixed to the bottom 9b of the metal case 9 with an adhesive such as an epoxy resin or the like, to accomplish the piezoelectric actuator having a hermetically sealed structure.

The prior piezoelectric actuator as mentioned above has such a structure that the electrostrictive effect element is sealed with a contact pressure due to the O ring and as a result there are the following drawbacks in the prior piezoelectric actuator:

(1) Because tensile strength of the electrostrictive effect element in the stacking direction thereof is weak, the element is broken when the tensile force is applied to the stacking direction from the outside in assembling the element.

(2) The electrostrictive effect element is broken when the element is pressed through the metal member in a direction perpendicular to the stacking direction of the element by external force.

In addition, U.S. Pat. No. 4,460,842 discloses means for giving a preload by a cut-in armored case. In the prior art, however, it is impossible to accomplish a hermetic sealing with the means. GB 2087659 and Japanese Utility Registration Public Disclosure Nos. 39664/1989 and 92156/1989 disclose the use of a bellows case but do not preloaded bellows.

SUMMARY OF THE INVENTION

It is an object of the invention to provide an improved piezoelectric actuator wherein it is possible to prevent break or rupture of an electrostrictive effect element in time when tensile force is applied to the element from the outside in mounting it and further it is possible to prevent break or rupture of the element or the addhesive portion in the end face thereof even if the external force is applied to the direction perpendicular to the stacking direction of the electrostrictive effect element through the metal member or hermetic terminal and a method of manufacturing the above piezoelectric actuator which has a good productionability and an easily controlled compacting force.

The above object is accomplished by a piezoelectric actuator which comprises an electrostrictive effect element which is formed by stacking a plurality of electrostrictive materials and internal electrodes by turns, a metal case provided with a flanged mounting portion on the periphery thereof, a metal member provided with a flanged mounting portion on the periphery thereof, and hermetically sealed terminals, the element being hermetically sealed by the metal case, the metal member and the hermetically sealed terminals, either of said metal case or said metal member being provided with an expansion and contraction portion, the flanged mounting portion provided on the metal member being butted against to the flanged mounting portion provided on the metal case so that the contraction force in the expansion and contraction portion is applied to the stacking direction of the electrostrictive effect element and being joined to the flanged mounting portion provided on the metal case.

The above object is also accomplished by a piezoelectric actuator which comprises an electrostrictive effect element which is formed by stacking a plurality of electrostrictive materials and internal electrodes by turns, a metal case provided with a flanged mounting portion on the periphery thereof, a metal member provided with a flanged mounting portion on the periphery thereof and hermetically sealed terminals, the element being hermetically sealed by the metal case, the metal member and the hermetically sealed terminals, either of the metal case or the metal member being provided with an expansion and contraction portion, the flanged mounting portion provided on the metal member being provided with an annular projection which is raised from the mounting portion to the extent of a certain amount and the flanged mounting portion being butted against the raised portion so that the contraction force in the expansion and contraction portion is applied to the stacking direction of the electrostrictive effect element and being joined to said projection crushed to the extent of a certain amount.

The above object is also accomplished by a method of manufacturing a piezoelectric actuator wherein an electrostrictive effect element which is formed by stacking a plurality of electrostrictive materials and internal electrodes by turns is hermetically sealed by a metal case, a metal member and hermetically sealed terminals, which comprises the steps of:

providing the metal case with a flanged mounting portion being provided on the periphery thereof and the metal member with hermetically sealed terminals and a flanged mounting portion being provided on the periphery thereof, either of the metal case or metal member being provided with an expansion and contraction portion so that a contraction force is applied to the sealed electrostrictive effect element in a stacking direction thereof;

receiving the electrostrictive effect element in the metal case and said metal member and connecting the element to the hermetically sealed terminals;

securing the element on said metal members and said metal case to the metal member in such a state that a gap having a certain size is provided between the flanged mounting portions on the metal case and said metal member;

butting the flanged mounting portion on the metal member against the flanged mounting portion on the metal case in such a state that the expansion and contraction portion is expanded to the extent of the gap size and holding the butted portions; and sealing and joining the butted portions by means of a welding or the like.

The above object is also accomplished by a method of manufacturing a piezoelectric actuator wherein an electrostrictive effect element which is formed by stacking a plurality of electrostrictive materials and internal electrodes by turns is hermetically sealed by a metal case, a metal member and hermetically sealed terminals, which comprises the steps of:

providing the metal case with a flanged mounting portion being provided on the periphery thereof and the metal member with hermetically sealed terminals and a flanged mounting portion on the periphery thereof being provided with an annular projection which is raised to the extent of a certain amount on the joining face in order to join to the metal case, either of the metal case or metal member being provided with an expansion and contraction portion so that a contraction force is applied to the sealed electrostrictive effect element in a stacking direction thereof;

receiving the electrostrictive effect element in the metal case and said metal member and connecting the element to the hermetic terminals;

butting the flanged mounting portion on said metal case against the flanged mounting portion on the metal member and holding the butted portions; and crushing the annular projection to extent of a certain size and sealing the mounting portions.

In this invention, the electrostrictive effect element is inserted in the metal case having an expansion and contraction function and a sealing treatment is made in such a state that a compressive force is previously applied to the element. Thus, it is possible to obviate defects of the prior piezoelectric actuator.

BRIEF DESCRIPTION OF THE DRAWINGS

By way of example of the many features and advantages of the invention, an illustrative embodiment in the piezoelectric actuator is described below and shown in the accompanying drawings, in which:

FIGS. 7(a) and 7(b), and FIG. 8 are a diagram showing an another process of making the piezoelectric actuator as shown in FIG. 3.

DETAILED DESCRIPTION OF THE PREFERRED EMBODIMENT

Next, this invention will be described with reference to the accompanying drawings.

Figure 1:
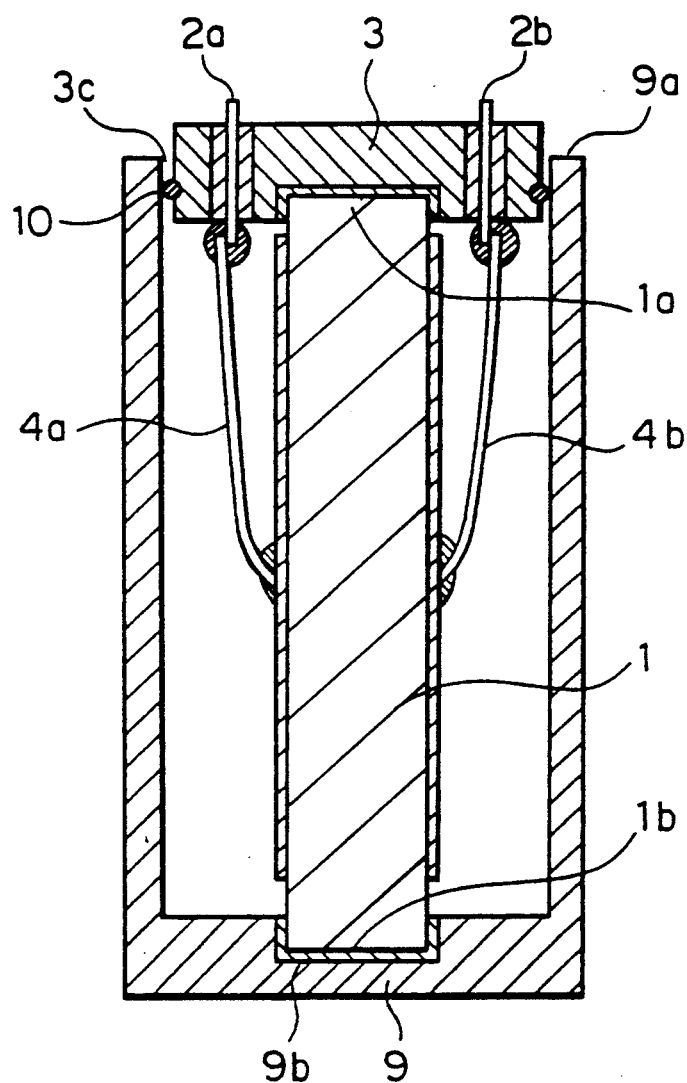
FIG. 1 shows a longitudinal section of the prior piezoelectric actuator which is received in a metal case.
Figure 2:
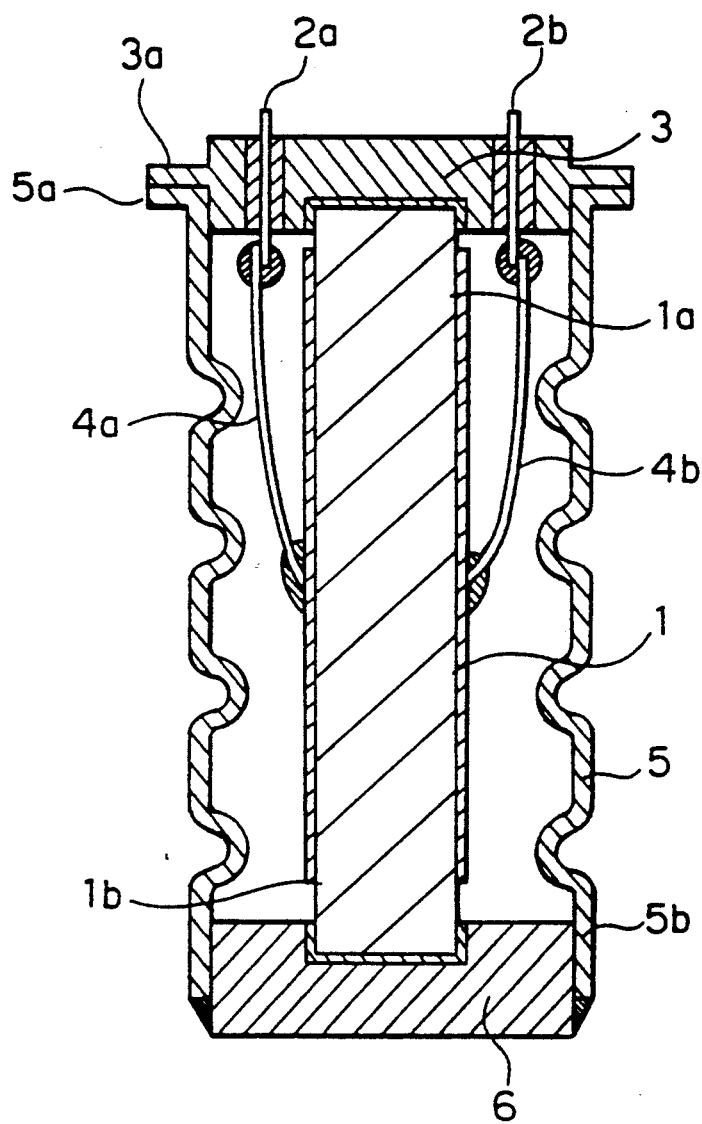
FIG. 2 shows a longitudinal section of a piezoelectric actuator according to the first embodiment of this invention.

FIG. 2 shows a longitudinal section of a piezoelectric actuator according to the first embodiment of this invention.

This piezoelectric actuator comprises an electrostrictive effect element 1, a metal member 3, a metal member 6 and a metal case 5, the element being formed by stacking a plurality of electrostrictive materials and internal electrodes by turns, the metal member 3, which is made in a circular form by stainless steel, having a U-shaped section and being provided with a flanged mounting portion 3a on the periphery thereof and a pair of lead terminals (e.g. hermetic terminals) 2a and 2b, the metal member 6, which is made in a circular form by stainless steel, having a U-shaped section and the metal case 5, such as bellows or the like, which is made from stainless steel and has an expansion and contraction function, having an internal diameter longer than an outer diameter of the electrostrictive effect element 1 and approximately similar to an outer diameter of the metal members 3 and 6 and being provided with a flanged mounting portion 5a on the periphery of one opening (the upper portion) thereof. In this piezoelectric actuator, the metal members 3 and 6 are secured on the both ends of the electrostrictive effect element 1 and the metal case and the metal members 3 and 6 are sealed and joined with welding to hermetically seal the element 1. In addition, the expansion and contraction portion of the metal case 5 is formed so that the contraction force of the metal case is applied to the stacking direction of the element 1 by previously expanding the portion to the extent of a certain size.

Next, a method of manufacturing a piezoelectric actuator according to this invention is as follows.

First, an electrostrictive effect element 1 is made as follows. An organic binder is mixed with powders of a multicomponent solid solution ceramic having perovskite crystal structure to form a green sheet having a thickness of about 100 μm and a pasty internal electrode conductor of silver is coated thereon and dried. Then, the coated sheets are stacked into several tens of layers (e.g. 64 layers) and sintered to form a laminated product. The side of the laminated product has exposed ends of the silver internal electrode conductor. Thus, after selectively coating the ends with a glass insulating film, an external electrode conductor is formed on the side and the silver internal electrode conductors are connected thereto on every other layer and alternately to form two comb-teeth electrodes. Then, lead wires 4a and 4b are connected to the external electrode conductor with solder and only the side is coated with a resin U.S. Pat. No. 4,780,639, Oct. 25, 1988.

The thus-made electrostrictive effect element 1 is fixed with an adhesive such as an epoxy resin or the like so that the element 1 rises perpendicularly on the concave portion formed on the inside face of the metal member (the upper part) 3 with the flanged mounting portion 3a on the periphery thereof. Then, the lead wires 4a and 4b of the element 1 are connected to the inside ends of the hermetic terminals 2a and 2b, respectively, with solder.

Then, in a metal case 5 with a flanged mounting portion 5a on the periphery of one opening thereof, the other opening 5b and a metal member 6 are previously sealed and joined. Thereafter, the electrostrictive effect element 1, on the one end 1a of which the metal member 3 is secured, is inserted into the metal case 5 through the opening at the upper mounting portion 5a thereof so that the other end 1b thereof is placed in the concave face of the metal member 6. And the element 1 is secured with the adhesive, such as an epoxy resin or the like, so that it is perpendicularly built in the concave face and in such a state that a gap having a certain amount (e.g. 0.1–0.2 mm) is provided between the flanged mounting portion 3a on the metal member 3 and the flanged mounting portion 5a on the metal case 5.

Then, the flanged mounting portion 5a is butted against the flanged mounting portion 3a in such a state that the expansion and contraction portion of the metal case 5 is expanded to the extent of the gap size and the butted portions are held with an equipment. Thereafter, the flanged mounting portions are sealed and joined with welding or the like.

If the spring constant of the metal case 5 is set so that the contraction force of the metal case 5 against the expanded amount thereof corresponding to the size of the gap between the above amounting portions is about 20–100% (e.g. 20–50 kg.f) of the maximum originating stress of the electrostrictive effect element 1, it is possible to form the piezoelectric actuator received in the metal case, wherein the electrostrictive effect element 1 is assembled and hermetically sealed in such a state that it is previously compressed with the force corresponding to about 20–100% of the maximum originating stress.

Figure 3:
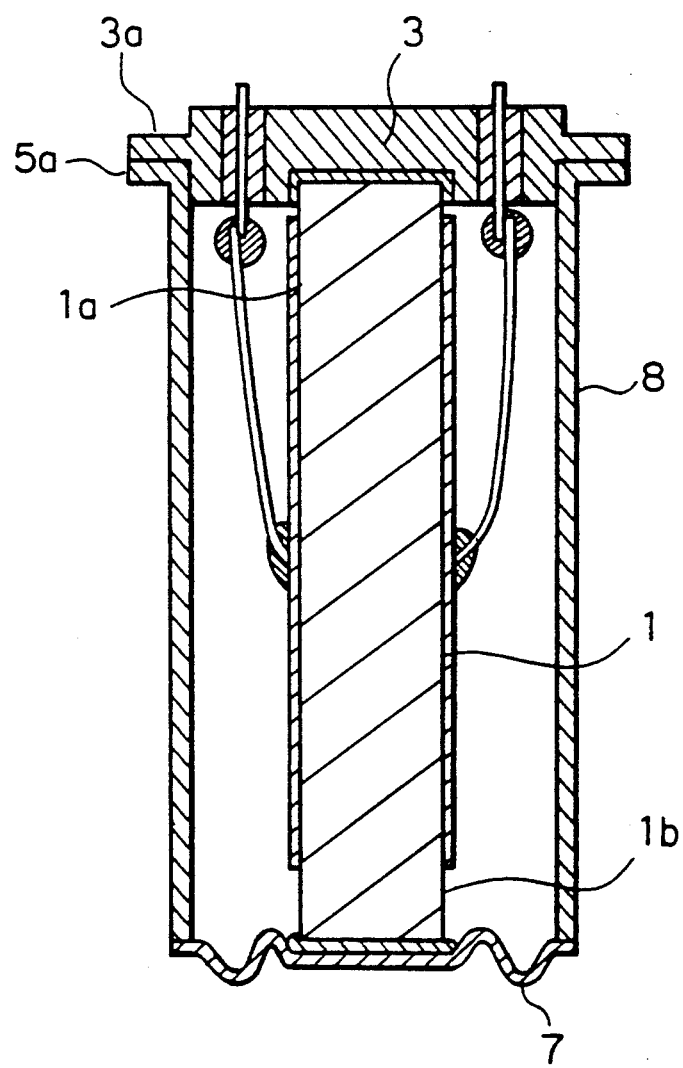
FIG. 3 shows a longitudinal section of a piezoelectric actuator according to the second embodiment of this invention.

FIG. 3 shows a longitudinal section of the piezoelectric actuator according to the second embodiment of this invention.

This embodiment is different from the first embodiment in the points that a diaphragm 7 is mounted instead of the lower metal member 6, the metal case 8 without an expansion and contraction function is used and a concave face of the diaphragm 7 is adhered to the lower end of the electrostrictive effect element 1.

This embodiment has an advantage that the diaphragm 7 and the metal case 5 can be made at a lower cost as compared with the first embodiment.

As described in the foregoing, in this invention, either of the metal case or the metal member is provided with the expansion and contraction portion and each of the metal case and the metal member is provided with the flanged mounting portion on the periphery thereof. Before the electrostrictive effect element is sealed, the expansion and contraction portion is held in an expanded state and the mounting portion of the metal case is butted against the mounting portion of metal member, as a result a compressive force being previously applied to the element by the expansion and contraction portion. Then, the sealing treatment is carried out. This invention exerts the following effects.

(1) When the tensile force from the outside is applied to the element in assembling, it is possible to prevent the break or rupture of the element.

(2) Even if the external force is applied to the element through the hermetic terminal, i.e. the metal member, in a direction perpendicular to the stacking direction of the element, it is possible to prevent the break or rupture of the element or the joining portion on the end thereof.

(3) The sealing treatment, wherein the compresive force is applied the element by the mounting portions, can be easily carried out.

Figure 4:
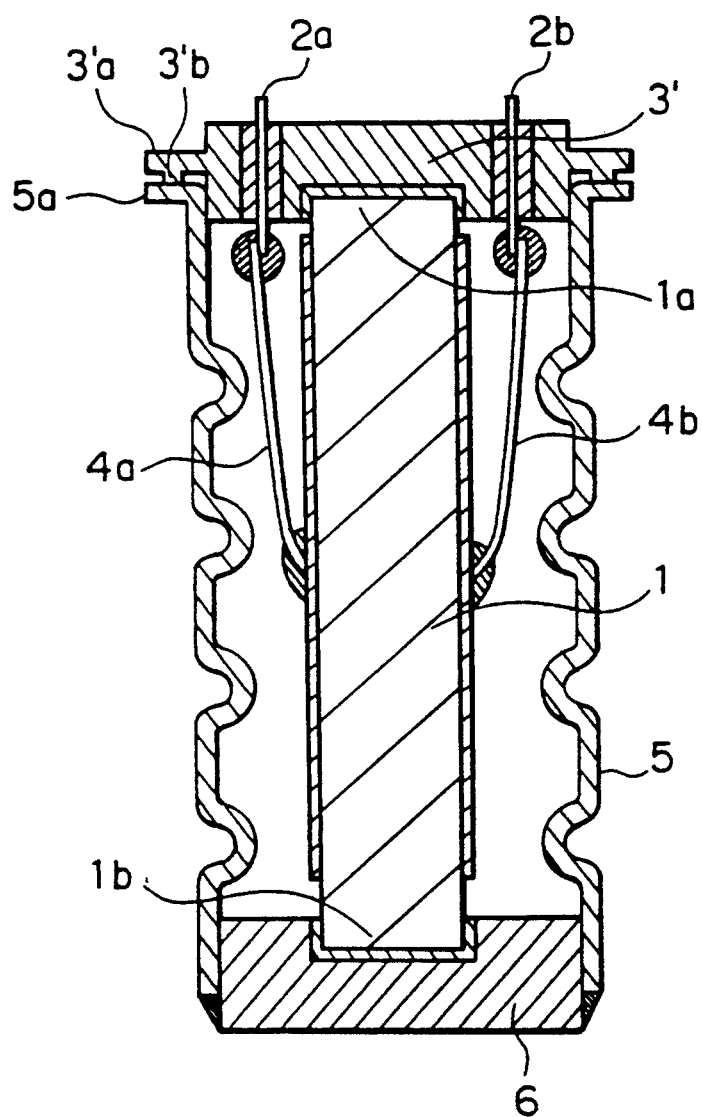
FIG. 4 shows a longitudinal section of a piezoelectric actuator according to the third embodiment of this invention.
Figure 5A:
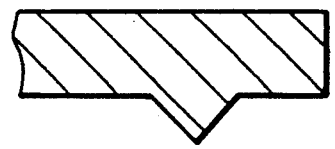
FIGS. 5(a)-5(d) show a longitudinal section of a projection as shown in FIG. 4.
Figure 5B:
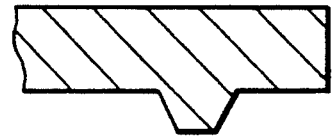
Figure 5C:
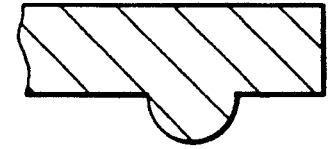
Figure 5D:
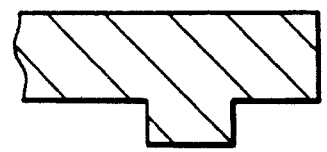

Next, FIG. 4 shows a longitudinal section of the piezoelectric actuator according to the third embodiment of this invention.

This piezoelectric actuator is the same as the piezoelectric actuator as shown in FIG. 2, except that there is used a preprocessed circular metal member 3' with a flanged mounting portion 3'a on the periphery thereof which is provided with an annular projection 3'b. The projection is raised from the mounting portion to the extent of a certain amount (e.g. 0.1–0.4 mm) and is formed in a form of a profile such as a triangle, trapezoid or the like in section, as shown in FIGS. 5(a)–5(d). In addition, the metal case 5 and the metal members 3' and 6 are sealed and joined with welding in such a state that the projection 3'b is crushed to the extent of a certain amount and the expansion and contraction portion is expanded to the extent of a certain amount. And the contraction force of the metal case is applied to the stacking direction of the element 1.

Next, a method of manufacturing the piezoelectric actuator as shown in FIG. 4 is the same as that the piezoelectric actuator as shown in FIG. 2, except for the following points.

After the lead wires 4a and 4b of the electrostrictive effect element 1 are connected to the inside ends of the hermetic terminals 2a and 2b, respectively, with solder, the element 1 on which the metal member 3 is secured is inserted into the metal case 5 through the opening at the upper mounting portion 5a thereof so that the other end 1b thereof is placed in the concave face of the metal member 6. And, the element 1 is secured with the adhesive, such as an epoxy resin or the like, so that it is perpendicularly built in the concave face. Thereafter, the metal case 5 and the metal member 6 are sealed and joined with a welding or the like, while holding with an equipment so as to bring the projection 3'b of the metal member 3 into contact with the mounting portion 5a of the metal case 5.

Then, a pair of the upper and lower welding electrodes composed of NBR, beryllium-copper or the like and which are in a cylindrical form are arranged so as to put the butted portions (i.e. the butted mounting portions of the metal case 5 and the metal member 3) between the electrodes. Under this circumstance, the mounting portions 3a and 5a are pressurised by way of the welding electrodes (e.g. 100–200 kg/cm$^2$) and simultaneously a great electric current (e.g. 10–20 KA) is applied thereto for the prescribed time (e.g. for 2–5 seconds), whereby the projection 3b of the metal member 3 is crushed to the extent of a certain amount (e.g. 0.1–0.4 mm) and the butted portions are sealed and joined with a resistance welding to seal off the metal member 3 and the metal case 5. In this case, if the spring constant of the metal case 5 is set so that the contraction force of the metal case 5 against the expanded amount thereof corresponding to the crushed amount in the projection 3'b is about 20–100% (e.g. 20–50 kg.f) of the maximum originating stress of the electrostrictive effect element 1, it is possible to form the piezoelectric actuator received in the metal case 5, wherein the element 1 is assembled and hermetically sealed in such a state that it is previously compressed with the force of about 20–100% of the maximum originating stress.

Figure 6:
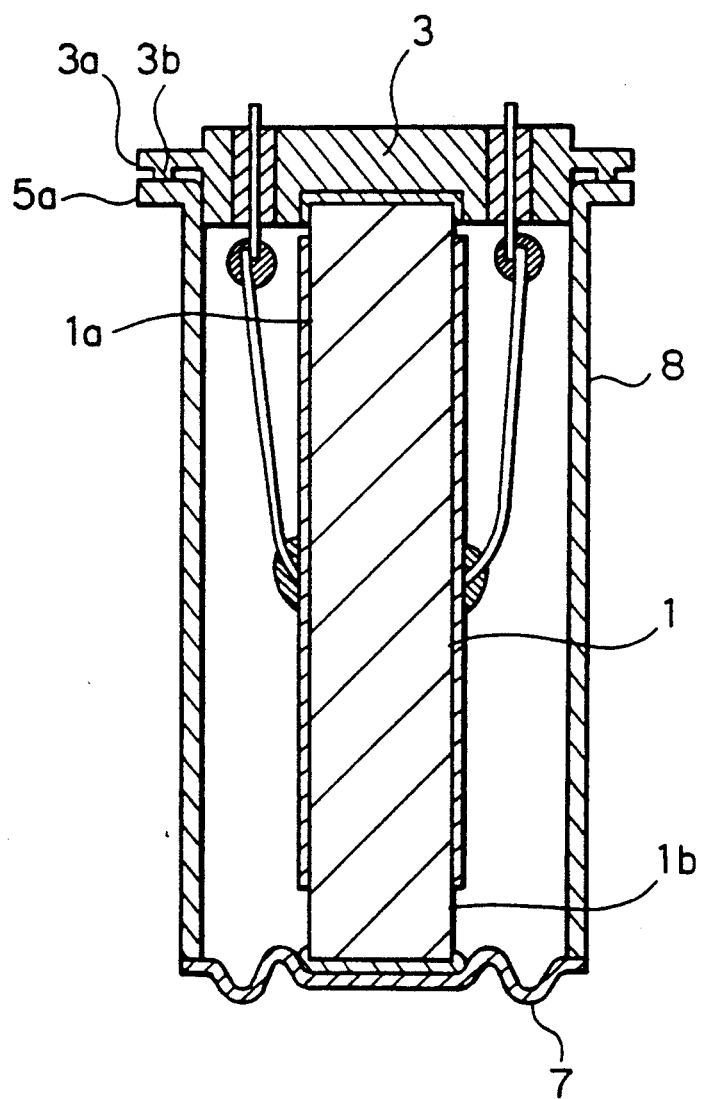
FIG. 6 shows a longitudinal section of a piezoelectric actuator according to the forth embodiment of this invention.

FIG. 6 shows a longitudinal section of the piezoelectric actuator according to the forth embodiment of this invention.

Figure 8:
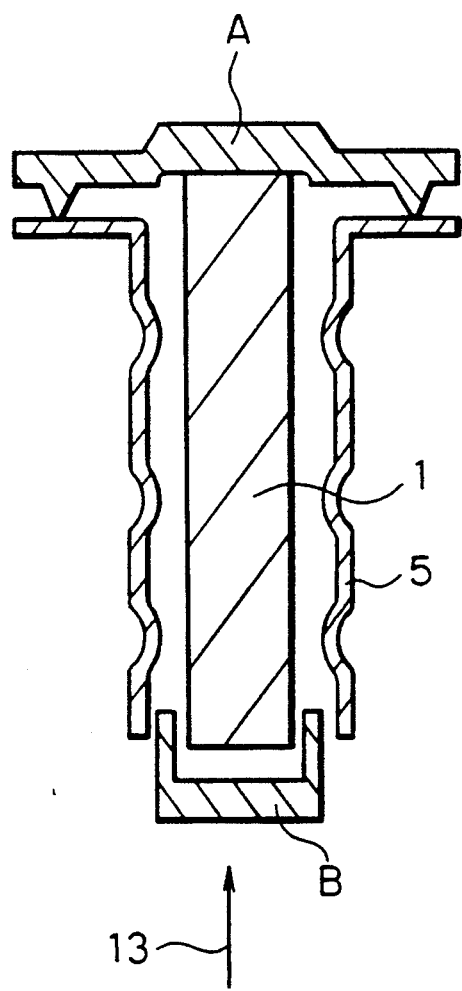

FIGS. 7 (a) and 7 (b), and FIG. 8 are a diagram showing an another precess of making the piezoelectric actuator as shown in FIG. 3.

This embodiment is different from the third embodiment in the points that a diaphragm 7 is mounted instead of the lower metal member 6, the metal case 8 without an expansion and contraction function is used and a concave face of the diaphragm 7 is adhered to the lower end of the electrostrictive effect element 1.

This embodiment has an advantage that the diaphragm 7 and the metal case 5 can be made at a lower cost as compared with the third embodiment.

Moreover, FIGS. 7 (a) and 7 (b), and FIG. 8 are a diagram showing an another process of making the piezoelectric actuator as shown in FIG. 3, i.e. a process of hermetically sealing the electrostrictive effect element, which was prepared as mentioned above, by subjecting a metal case (e.g. a bellows case etc.) to an amount of preload. In this case, the electrostrictive effect element 1 is secured on fitments A ang B, which correspond to the metal members 3' and 6 as shown in FIG. 3, respectively, with an adhesive such as an epoxy resin or the like. Thus, when the projection on the fitment A is butted against the mounting portion of the bellows case and the butted portions are pressurized by applying welding electrodes 11 and 12 thereto, the element is compressed and the bellows case is expanded (d), for example 0.2 mm, and at the same time a welding and a hermetic sealing 10 are performed. The amount of preload can be easily calculated and controlled on the basis of spring constant of the bellows case and the crushed amount of the projection. In addition, the amount of preload can be selected and applied depending on the amount of the projection to be crushed or the spring constant of the bellows case. The former is preferred.

Furthermore, the size of the bellows case and the height of the electrostrictive effect element can be varied depending on the manufacturing process and the like. Therefore, in order to absorb such a variability and impose an amount of preload on the bellows case, the fitment A on which the element is secured as shown in FIG. 8, is first butted against the mounting portion on the bellows case and the thus butted portions are held, and thereafter the fitment B is connected with the element and the bellows case as shown in an arrow 13 in FIG. 8.

As described in the foregoing, in this invention, either of the metal case or the metal member is provided with the expansion and contraction portion and each of the metal case and the metal member is provided with the flanged mounting portion on the periphery thereof, the mounting portion of the metal member is provided with the annular projection which is raised to the extent of a certain amount therefrom. Before the electrostrictive effect element is sealed, the mounting portion on the metal case is butted against the projection on the metal member and the butted portions is held. Thereafter, the butted portions are sealed and joined while crushing the projection, as a result a compressive force being previously applied to the element by the expansion and contraction portion.

This invention exerts the following effects.

(1) When the tensile force from the outside is applied to the element in assembling, it is possible to prevent the break or rupture of the element.

(2) Even if the external force is applied to the element through the hermetic terminal, i.e. the metal member, in a direction perpendicular to the stacking direction of the element, it is possible to prevent the break or rupture of the element or the joining portion on the end thereof.

(3) Operation applying the compressive force and sealing treatment can be carried out at the same time and thus there is a good productivity.

(4) The compressive force varies narrowly, since it can be controlled by the amount of the projection.

In addition, according to this invention, the bellows case is provided with the flanged portion and the bellows case is extended with the flanged portion, whereby the bellows case is entirely and uniformly extended and thus high reliability is accomplished.

Also, the flanged portion of the fitment is provided with the projection and the bellows case is extended starting from the point where the projection contacts with the flanged portion of the bellows case and thus it is possible to always give a constant preload. The preload can be set to the required value by changing the hight of the projection.

Moreover, it is possible to extend the bellows case by utilizing pressure loading which is applied in carrying out a resistance welding for hermetic sealing and thus the resistance welding process (the hermetic sealing process) and the process for giving the preload are accomplished at the same time, whereby good productivity is attained.

What is claimed is:

1. A piezoelectric actuator which comprises an electrostrictive effect element which is formed by stacking a plurality of electrostrictive materials and internal electrodes by turns, a metal case having a flanged mounting portion with a flat surface on a periphery thereof, a metal member having a flanged mounting portion with a flat surface on the periphery thereof and having an annular portion which rises from said flat surface of the flanged mounting portion by a certain amount, another metal member and hermetically sealed terminals; said electrostrictive effect element being hermetically sealed within the metal case, the metal members and the hermetic terminals; one of said metal case or said another metal member having an expansion and contraction portion, and said flat surface of the flanged mounting portion of said metal case being butted and joined hermetically to said raised portion of the flat surface of the flanged mounting portion of the metal member to crush said raised annular portion of the metal member by a certain amount to cause a gap between said flat surface of the flanged mounting portion of the metal case and said flat surface of the flanged mounting portion of the metal member and to apply a compression stress commensurate with the height of the crushed raised portion to said electrostriction effect element in the stacking direction thereof.

2. A piezoelectric actuator according to claim 1, wherein said metal member has a projection located on said flanged mounting portion of said metal member, facing to said flanged mounting portion of said metal case.

3. A piezoelectric actuator according to claim 1, wherein said metal case has a projection located on said flanged mounting portion of said metal case, facing to said flanged mounting portion of said metal member.

4. A piezoelectric actuator as set forth in claim 1, wherein said terminals are glass terminals.

5. A piezoelectric actuator as set forth in claim 1, wherein said annular portion rises from said flat surface of the mounting portion by 0.1–0.4 mm.

* * * * *